(12) United States Patent
Tsuji et al.

(10) Patent No.: US 7,982,522 B2
(45) Date of Patent: Jul. 19, 2011

(54) SEMICONDUCTOR INTEGRATED CIRCUIT FOR REALIZING AN AMPLIFIER HAVING RINGING REDUCTION CIRCUITRY

(75) Inventors: Nobuaki Tsuji, Hamamatsu (JP); Hirotaka Kawai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/690,090

(22) Filed: Jan. 19, 2010

(65) Prior Publication Data

US 2010/0164590 A1 Jul. 1, 2010

Related U.S. Application Data

(62) Division of application No. 11/726,613, filed on Mar. 22, 2007, now abandoned.

(30) Foreign Application Priority Data

Mar. 22, 2006 (JP) ................................ 2006-079771
Jul. 11, 2006 (JP) ................................ 2006-190991

(51) Int. Cl.
*H03L 5/00* (2006.01)
(52) U.S. Cl. ........... 327/310; 327/312; 327/321; 361/56
(58) Field of Classification Search .............. 327/310, 327/312, 321; 361/56, 90
See application file for complete search history.

(56) References Cited

U.S. PATENT DOCUMENTS

| 5,396,562 | A | 3/1995 | Ishimitsu et al. |
| 5,633,939 | A | 5/1997 | Kitani et al. |
| 6,201,375 | B1 * | 3/2001 | Larson et al. ................. 323/277 |
| 6,222,403 | B1 | 4/2001 | Mitsuda |
| 6,333,623 | B1 * | 12/2001 | Heisley et al. ................. 323/280 |
| 6,377,033 | B2 * | 4/2002 | Hsu ................................ 323/274 |
| 6,552,594 | B2 | 4/2003 | Lin |
| 6,646,840 | B1 | 11/2003 | Sugerman et al. |
| 6,760,205 | B1 * | 7/2004 | Gaboury .......................... 361/56 |
| 6,891,708 | B2 * | 5/2005 | Hutamura et al. ............. 361/100 |
| 7,274,177 | B2 * | 9/2007 | Huang et al. ................... 323/277 |
| 7,280,328 | B2 | 10/2007 | Arai et al. |
| 7,295,412 | B2 * | 11/2007 | Sasaki et al. ................. 361/91.1 |
| 7,570,472 | B2 * | 8/2009 | Li .................................... 361/90 |

FOREIGN PATENT DOCUMENTS

| JP | 04-287415 | 10/1992 |
| JP | 05-063481 | 3/1993 |
| JP | 5075367 | 3/1993 |
| JP | B-5-16153 | 3/1993 |
| JP | 8065200 | 3/1996 |
| JP | 08-321728 | 12/1996 |

(Continued)

OTHER PUBLICATIONS

Office Action of the IPO, Taiwan Patent Application No. 096109940, issue date May 21, 2010, 9 pages.

(Continued)

*Primary Examiner* — Kenneth B. Wells
(74) *Attorney, Agent, or Firm* — Pillsbury Winthrop Shaw Pittman LLP

(57) ABSTRACT

An N-channel transistor is provided as a switch between a high potential power line and a low potential power line. A high-pass filter is constituted by a capacitor and a resistor. When a voltage between the high potential power line and the low potential power line is started to oscillate by a switching operation, the high-pass filter causes a high-pass component thereof to pass, thereby turning ON the N-channel transistor to reduce a ringing.

5 Claims, 11 Drawing Sheets

FOREIGN PATENT DOCUMENTS

| | | |
|---|---|---|
| JP | A-9-230951 | 9/1997 |
| JP | 10-126182 | 5/1998 |
| JP | 11346147 | 12/1999 |
| JP | 2000-216673 | 8/2000 |
| JP | A-2001-309656 | 11/2001 |

OTHER PUBLICATIONS

The State Intellectual Property Office of the PRC: Notification of First Office Action for Patent Application No. 200710088747.7, dated Feb. 27, 2009 (4 pages).

Japanese Patent Office: Notification of Reasons for Refusal for Patent Application No. 2006-190991, dated Jul. 8, 2008.

Japanese Patent Office: Notice of Reasons for Refusal for Application No. 2006-188713, dated Jul. 8, 2008.

Japanese Patent Office: Notice of Reasons for Refusal for Application No. 2006-188718, dated Jul. 8, 2008.

Japanese Patent Office "Notice of Reasons for Refusal" Japanese Patent Application No. 2006-079771, Issue Date Oct. 26, 2010, 2 pages.

* cited by examiner

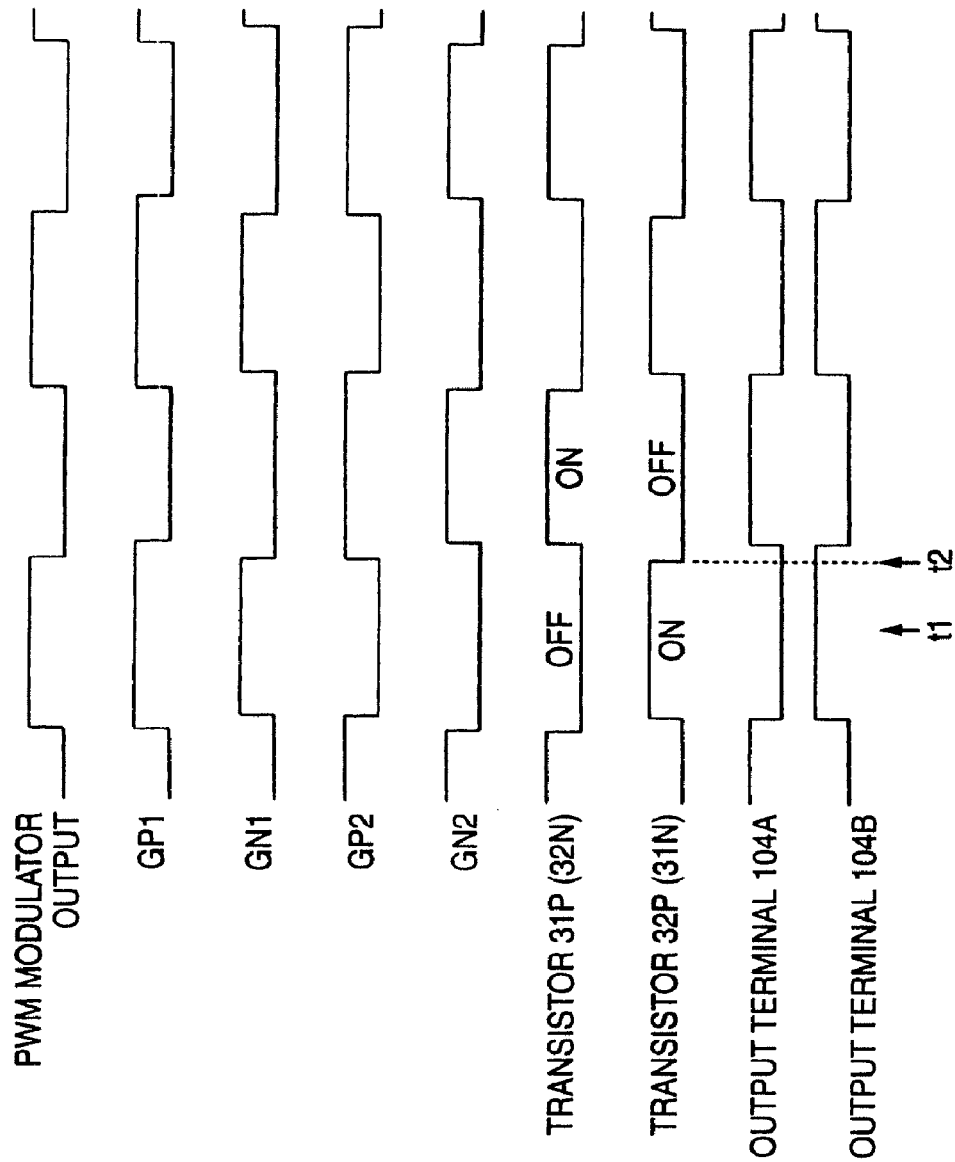

SEMICONDUCTOR INTEGRATED CIRCUIT FOR REALIZING AN AMPLIFIER HAVING RINGING REDUCTION CIRCUITRY

RELATED APPLICATIONS

This application is a divisional of U.S. patent application Ser. No. 11/726,613, filed Mar. 22, 2007, now abandoned, which is based upon, and claims priority from, Japanese Patent Applications Nos. 2006-079771 and 2006-190991, the contents of which are incorporated herein by reference.

BACKGROUND OF THE INVENTION

The present invention relates to a semiconductor integrated circuit and more particularly to a semiconductor integrated circuit which is suitable for a circuit for pulse driving a load such as a class-D amplifier.

As is well known, a class-D amplifier serves to turn ON/OFF a load driving output transistor and to intermittently carry out a conduction to a load. In the intermittent conduction to the load, a current flowing to parasitic inductances provided on a power line or a grounding conductor of the class-D amplifier is drastically changed. Therefore, noise is generated on these parasitic inductances, resulting in a ringing which appears in an output signal of the class-D amplifier. Such a ringing causes a deterioration in reproducing quality of the class-D amplifier, and furthermore, causes damage to the load or the class-D amplifier. For this reason, it is desired to reduce the ringing. Patent Document 1 has proposed a technique for decreasing a time gradient of an output signal waveform of an output transistor. By an application of the technique of this type to the class-D amplifier, the time gradient of the output signal waveform is decreased so that a current flowing to an output transistor can be prevented from being changed suddenly. Thus, it is possible to reduce the ringing.

Patent Document 1: Japanese Patent No. 3152204

However, the technique disclosed in the Patent Document 1 serves to decrease the time gradient of the output signal waveform. For this reason, there is a problem in that an operating speed of the class-D amplifier is sacrificed by the application of the technique. This problem is common to a semiconductor integrated circuit required to drive a load at a high speed and demanded to reduce a ringing in an output signal in addition to the class-D amplifier.

SUMMARY OF THE INVENTION

In consideration of the circumstances, it is an object of the invention to provide a semiconductor integrated circuit capable of reducing ringing in an output signal without sacrificing operating speed.

The invention provides a semiconductor integrated circuit comprising a switch provided between a high potential power line and a low potential power line, and a high-pass filter for causing a high-pass component of a voltage generated between the high potential power line and the low potential power line to pass and outputting the high-pass component as a signal to turn ON the switch.

According to the invention, when the voltage between the high potential power line and the low potential power line is about to oscillate by a switching operation, the high-pass component of the voltage is given to the switch through the high-pass filter so that the switch is turned ON. Therefore, an oscillating component of the voltage between the high potential power line and the low potential power line is eliminated by use of the switch so that ringing can be reduced.

The invention provides a ringing reduction circuit comprising a switching element inserted between an output signal line for transmitting an output signal of an output buffer circuit provided inside a semiconductor integrated circuit to a load provided outside the semiconductor integrated circuit and a high-potential power line or a low-potential power line for supplying a power supply voltage to the output buffer circuit; and a ringing detector for outputting a signal for turning on the switching element when ringing occurs in the output signal that is supplied to the load via the output signal line and the output signal exceeds a reference level in a positive or negative direction.

According to the invention, when ringing occurs in the output signal due to a switching operation of the output buffer circuit to and the output signal exceeds the reference level in the positive or negative direction, the switching element is turned on. As a result, a discharge occurs from the output signal line to the low-potential power line or the high-potential power line and the ringing is thereby reduced.

BRIEF DESCRIPTION OF THE DRAWINGS

FIG. 2 is a waveform diagram showing a waveform of each portion according to the embodiment.

DETAILED DESCRIPTION OF PREFERRED EMBODIMENTS

An embodiment of the invention will be described below with reference to the drawings.

Embodiment 1

Figure 1:
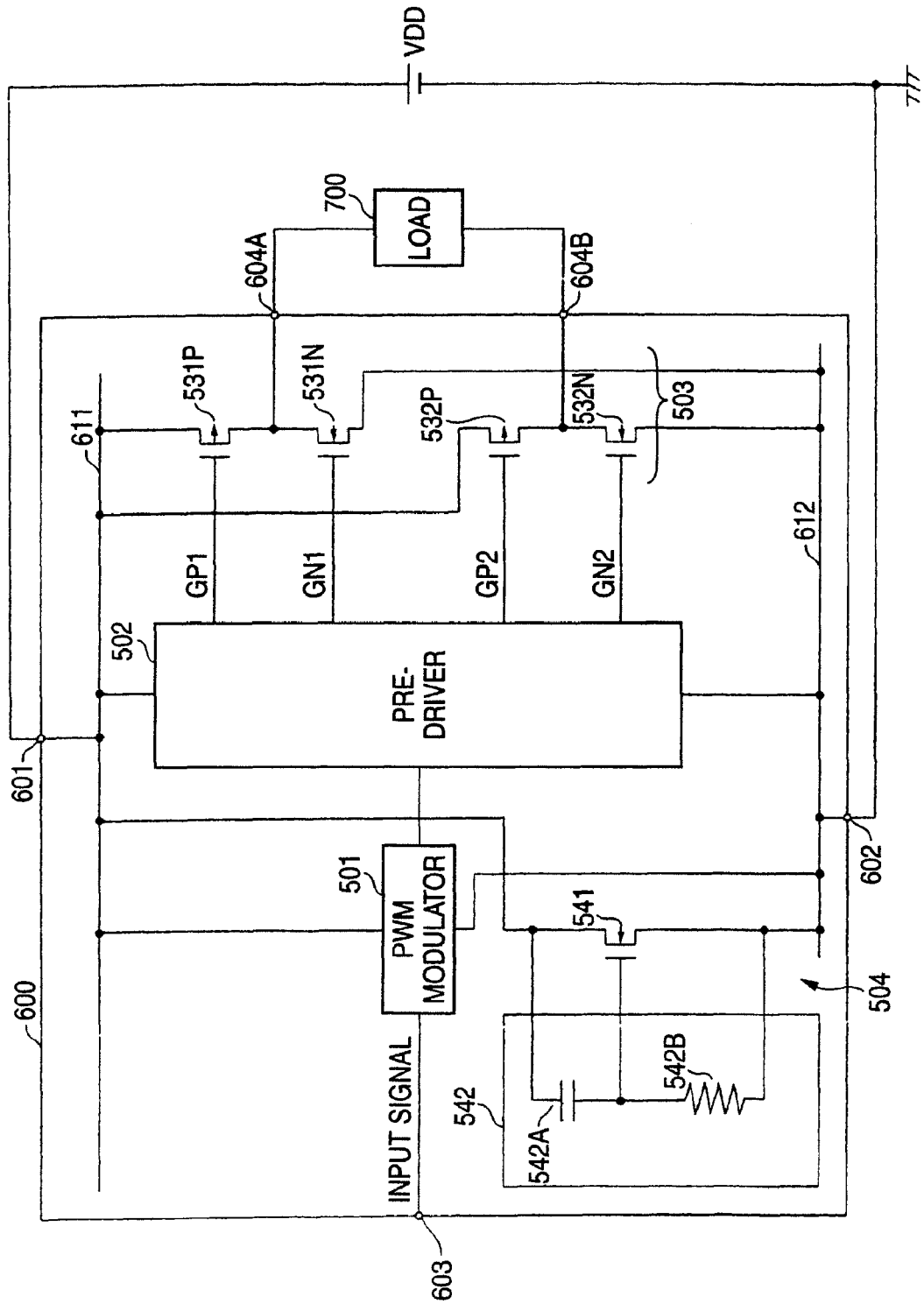
FIG. 1 is a circuit diagram showing a structure of a class-D amplifier according to an embodiment of the invention.

FIG. 1 is a circuit diagram showing a structure of a class-D amplifier 600 according to a first embodiment of a semiconductor integrated circuit in accordance with the invention. The class-D amplifier 600 has a high potential power terminal 601, a low potential power terminal 602, an input terminal 603, and output terminals 604A and 604B. The high potential power terminal 601 is connected to a positive electrode of a power supply VDD, and the low potential power terminal 602 is connected to a negative electrode of the power supply VDD and is grounded. In the example shown in the drawing, a single power supply is used. For this reason, the low potential power terminal 602 is grounded. In the case in which there is employed such a structure that a power supply for generating a positive source voltage and a power supply for generating a negative source voltage are used, however, it is preferable that the high potential power terminal 601 should be connected to an output terminal of the former power supply and the low potential power terminal 602 should be connected to an output terminal of the latter power supply. An audio signal is received from a sound source (not shown) at the input terminal 603. A load 700, which may include a low-pass filter and a speaker, is connected to the output terminals 604A and 604B.

The class-D amplifier 600 is obtained by forming each of the circuits shown in the drawing on a semiconductor substrate and sealing them in a package. A high potential power line 611 connected to the high potential power terminal 601 and a low potential power line 612 connected to the low potential power terminal 602 are formed on the semiconductor substrate. A source current is supplied from the power supply VDD to each circuit constituting the class-D amplifier 600 through the high potential power terminal 601 and the high potential power line 611. The source current passing through each circuit reaches the negative electrode of the power supply VDD through the low potential power line 612 and the low potential power terminal 602.

In the class-D amplifier 600, a PWM modulator 501 is a circuit for outputting a pulse subjected to a pulse width modulation corresponding to a level of an input signal given through the input terminal 603. A predriver 502 is a circuit for driving an output buffer circuit 503 in response to the pulse. In the example shown in the drawing, the output buffer circuit 503 has a so-called bridge structure and is constituted by a transistor pair including a P-channel field effect transistor (hereinafter referred to as a P-channel transistor) 531 P and an N-channel field effect transistor (hereinafter referred to as an N-channel transistor) 531 N which are provided between the high potential power line 611 and the low potential power line 612, and a transistor pair including a P-channel transistor 532P and an N-channel transistor 532N which are provided between the high potential power line 611 and the low potential power line 612. Each of the drains of the P-channel transistor 531 P and the N-channel transistor 531 N is connected to the output terminal 604A and each of the drains of the P-channel transistor 532P and the N-channel transistor 532N is connected to the output terminal 604B. The predriver 502 supplies pulses GP1, GN1, GP2 and GN2 to gates of the transistors 531 P, 531 N, 532P and 532N in order to carry out a conduction to the load 700 for a period corresponding to a width of a pulse supplied from the PWM modulator 501. In order to prevent a so-called through current, moreover, the predriver 502 includes a circuit for regulating a timing of the pulse supplied to the gate of each of the transistors in such a manner that two P-channel transistors and two N-channel transistors (that is, a set of the transistors 531 P and 531 N and a set of the transistors 532P and 532N) connected directly without the load 700 are not turned ON at the same time.

FIG. 2 is a waveform diagram showing an operation of each portion from the PWM modulator 501 to the load 700. As shown in FIG. 2, in the class-D amplifier 600, the pulses GP1, GN1, GP2 and GN2 to be transmitted to the gates of the transistors are generated in such a manner that the set of the P-channel transistor 531P and the N-channel transistor 532N and that of the P-channel transistor 532P and the N-channel transistor 531N are alternately turned ON. In the ON/OFF switching of each of the transistors, moreover, the pulses GP1, GN1, GP2 and GN2 are output from the predriver 502 in a state in which the timing is regulated as shown in the drawing in such a manner that the set of the P-channel transistor 532P and the N-channel transistor 531N are turned from OFF to ON after the set of the P-channel transistor 531P and the N-channel transistor 532N are turned from ON to OFF and the set of the P-channel transistor 531P and the N-channel transistor 532N are turned from OFF to ON after the set of the P-channel transistor 532P and the N-channel transistor 531N are turned from ON to OFF in order to prevent the through current.

A ringing reducing circuit 504 is peculiar to the embodiment 1. The ringing reducing circuit 504 is constituted by an N-channel transistor 541 and a high-pass filter 542. The N-channel transistor 541 has a drain connected to the high potential power line 611 and a source connected to the low potential power line 612. The N-channel transistor 541 is provided as a switch for causing an oscillating component thereof to be removed and reducing a ringing in the case in which a voltage between the high potential power line 611 and the low potential power line 612 is about to oscillate. In the semiconductor integrated circuit, usually, a transistor having a large size is inserted as an electrostatic breakdown protecting device between the high potential power line and the low potential power line. The N-channel transistor 541 may serve as the electrostatic breakdown protecting device. The high-pass filter 542 is obtained by inserting a capacitor 542A and a resistor 542B in series between the high potential power line 611 and the low potential power line 612, and a voltage on both ends of the resistor 542B is supplied as a gate-source voltage to the N-channel transistor 541. The high-pass filter 542 serves to cause a high-pass component having a certain frequency or more to pass and to provide the high-pass component at the N-channel transistor 541, thereby turning ON the N-channel transistor 541 when the high-pass component is generated on the voltage between the high potential power line 611 and the low potential power line 612. It is preferable that proper values should be selected for a capacitance value of the capacitor 542A and a resistance value of the resistor 542B corresponding to a frequency of a ringing to be reduced. As an example, the capacitor 542A has a capacitance value of 5 pF and the resistor 542B has a resistance value of 50 kΩ.

Figure 3A:
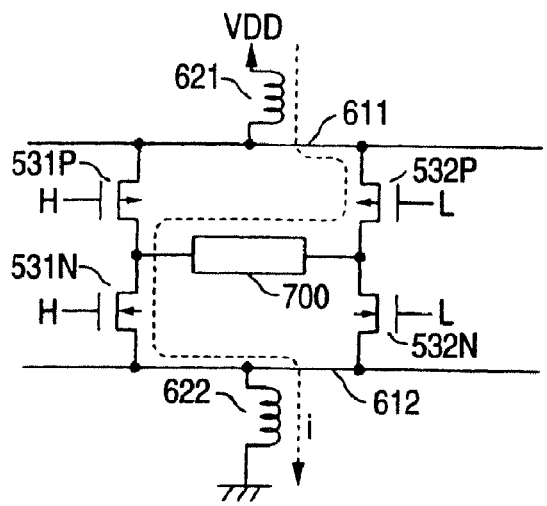
FIGS. 3A to 3C are diagrams showing an operation according to the embodiment.

Next, an operation according to the embodiment 1 will be described with reference to FIG. 2 and FIGS. 3A to 3C. First of all, at a time t1 shown in FIG. 2, the P-channel transistor 532P and the N-channel transistor 531N are ON and the P-channel transistor 531P and the N-channel transistor 532N are OFF as shown in FIG. 3A. For this reason, a source current i supplied from the power supply VDD flows through the P-channel transistor 532P, the load 700 and the N-channel transistor 531N in series. A path for the source current i includes a parasitic inductance 621 provided in a path from a positive electrode of the power supply VDD to the source of the P-channel transistor 532P and a parasitic inductance 622 provided in a path from the source of the N-channel transistor 531N to a negative electrode (=a ground) of the power supply VDD.

Figure 3B:
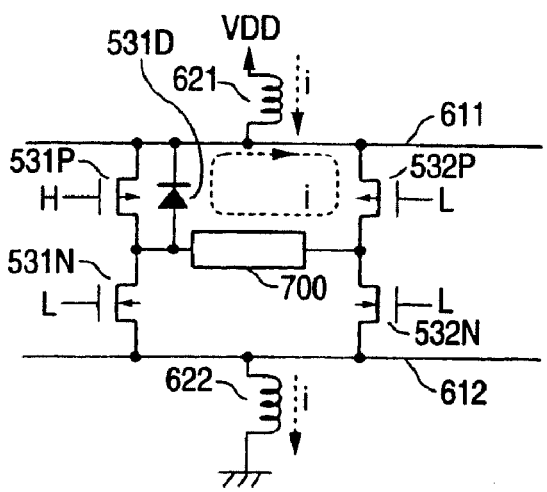
Figure 3C:
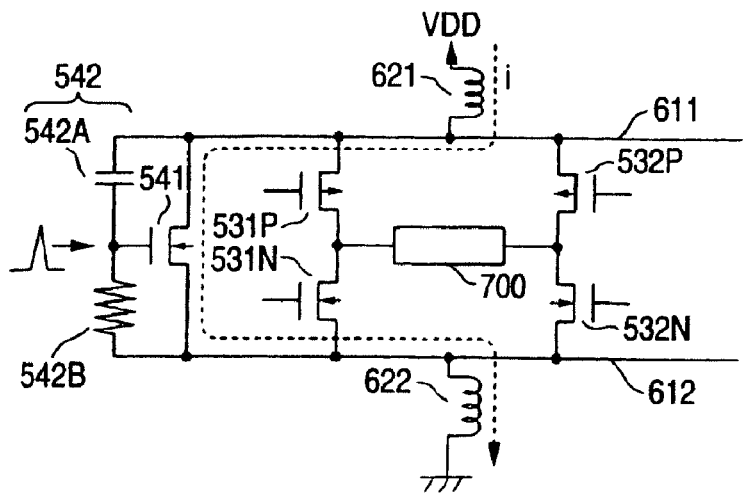

At a time t2 shown in FIG. 2, next, the P-channel transistor 532P and the N-channel transistor 531N are turned from ON to OFF. Ideally, the P-channel transistor 532P and the N-channel transistor 531N are turned OFF at the same time. In general, however, a shift is generated in a timing in which both of the transistors are turned OFF. As is illustrated in FIG. 3B, when the N-channel 531N is turned OFF in a state in which the P-channel transistor 532P is ON, a path for the source current i passing through the parasitic inductance 621 and a path for the source current i passing through the parasitic inductance 622 are blocked. Therefore, an oscillatory voltage is induced to both ends of the parasitic inductances 621 and 622. In the case in which the load 700 is an inductive load, moreover, a voltage to maintain the source current i flowing to the load 700 until that time is induced to the load 700. Therefore, an oscillatory current flows in a loop constituted by the load 700, a parasitic diode 531D provided between the P-channel transistor 531P and the semiconductor substrate, and the P-channel transistor 532P as shown in the drawing. For this reason, if some countermeasure is not taken, a great oscillation is generated on a voltage between the high potential power line 611 and the low potential power line 612 so that a ringing caused by the oscillation appears on a signal to be output to the load 700.

In the embodiment 1, however, when the oscillating component starts to be generated on the voltage between the high potential power line 611 and the low potential power line 612, it is provided to a gate of the N-channel transistor 541 through the high-pass filter 542 so that the N-channel transistor 541 is turned ON. For this reason, a current corresponding to the oscillating component generated between the high potential power line 611 and the low potential power line 612 flows to the N-channel transistor 541 so that the oscillating component is damped before it is increased. Accordingly, the ringing in the signal to be output to the load 700 is reduced. In the class-D amplifier 600, various switching operations are carried out in addition to the switching operation from the state shown in FIG. 3A to the state shown in FIG. 3B. Also in those cases, however, when the path for the current flowing to the parasitic inductance and the load is blocked and the voltage between the high potential power line 611 and the low potential power line 112 is about to oscillate, a high-pass component of the voltage turns ON the N-channel transistor 541. Consequently, the ringing is reduced.

As described above, according to the embodiment 1, it is possible to reduce the ringing without sacrificing the operating speed of the class-D amplifier 600. The foregoing is only illustrative and other various embodiments can be proposed for the invention. For example, the following embodiments can be proposed.

Figure 4:
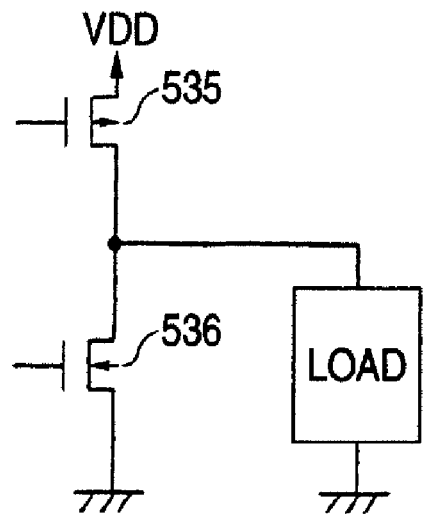
FIG. 4 is a circuit diagram showing an example of another structure of an output buffer circuit.

(1) While the invention is applied to the class-D amplifier including the output buffer circuit 503 having the bridge structure using two so-called P-channel and N-channel transistor pairs in the embodiment, the output buffer circuit may have a well-known structure constituted by a P-channel transistor 535 and an N-channel transistor 536 shown in FIG. 4.

Figure 5:
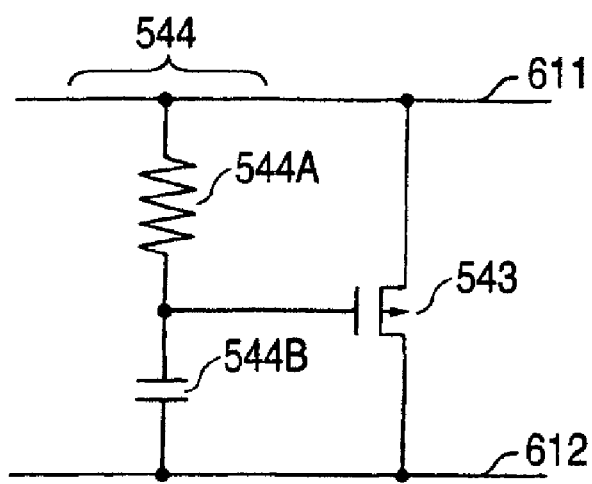
FIG. 5 is a circuit diagram showing an example of another structure of a ringing reducing circuit.

(2) It is also possible to use the P-channel transistor as a switch for reducing ringing. FIG. 5 shows this example. In this example, a P-channel transistor 543 has a source connected to the high potential power line 611 and a drain connected to the low potential power line 612. A high-pass filter 544 has a resistor 544A and a capacitor 544B inserted in series between the high potential power line 611 and the low potential power line 612 and a voltage on both ends of the resistor 544A is supplied as a gate-source voltage to the P-channel transistor 543. Also in this manner, it is possible to obtain the same advantages as those in the embodiment 1.

Embodiment 2

Figure 6:
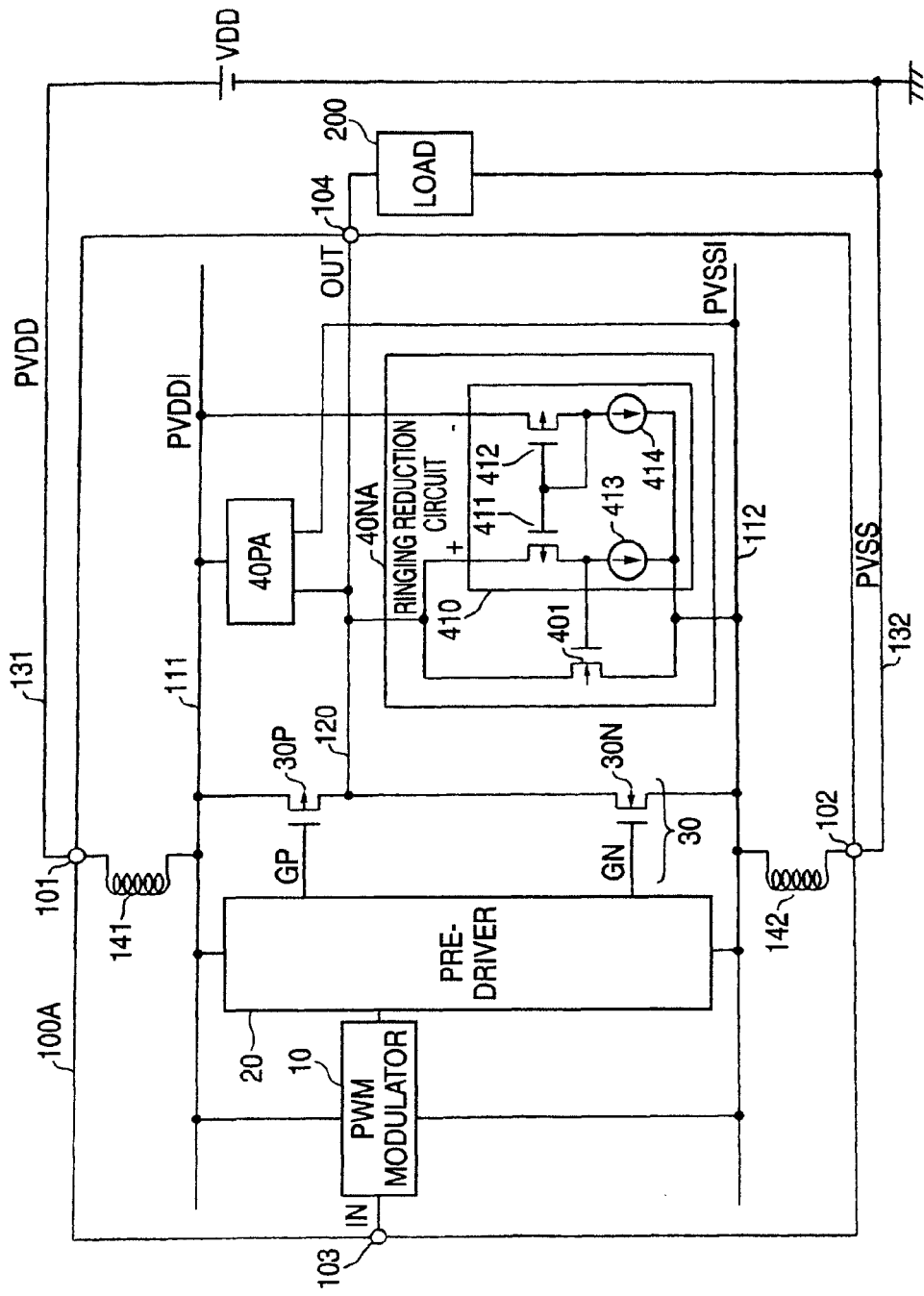
FIG. 6 is a circuit diagram showing the configuration of a class-D amplifier having ringing reduction circuits according to an embodiment 2 of the invention and, in particular, showing the configuration of a ringing reduction circuit that reduces an overshoot.
Figure 7:
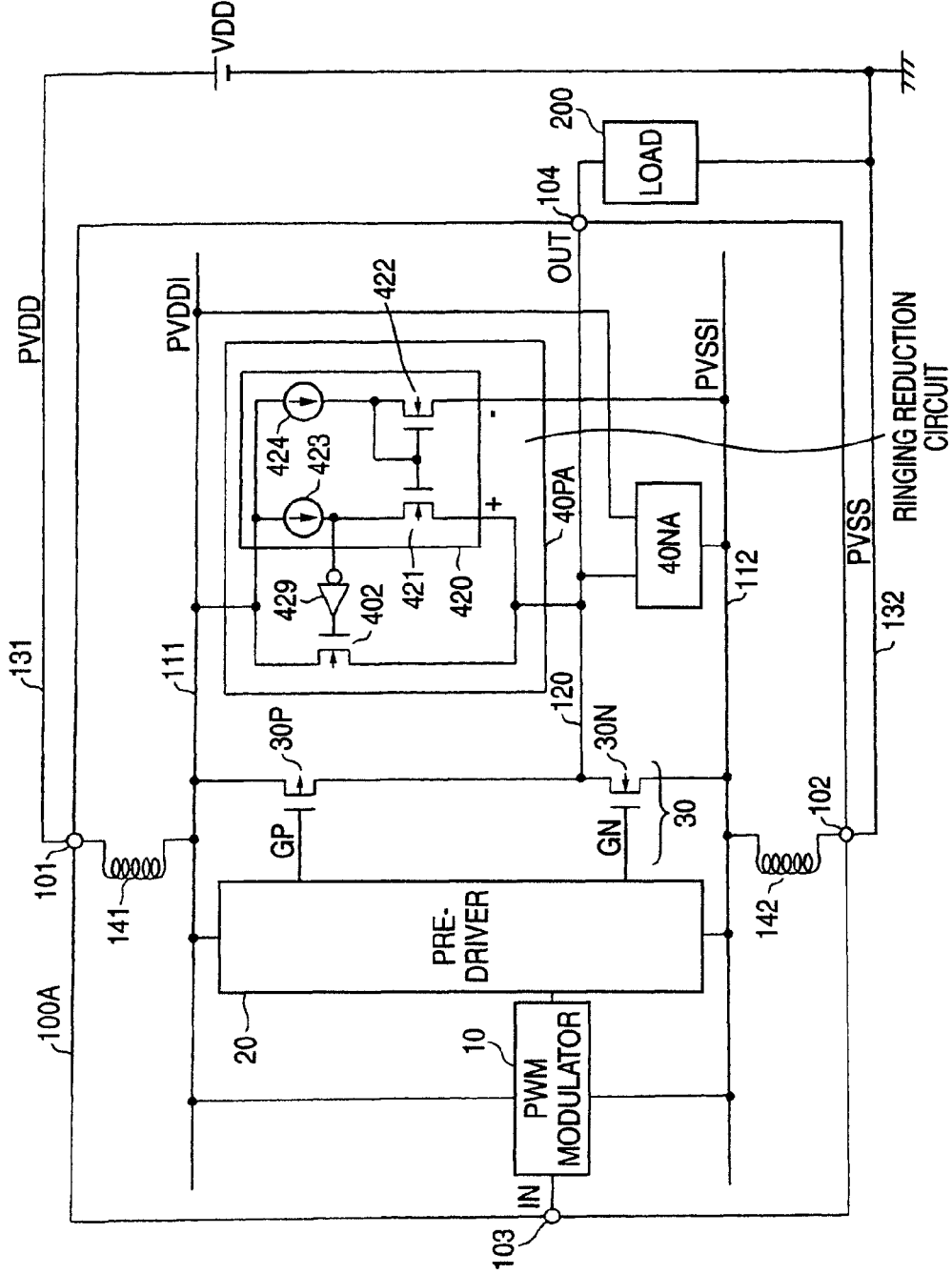
FIG. 7 is a circuit diagram showing the configuration of the same class-D amplifier of FIG. 6 and, in particular, showing the configuration of a ringing reduction circuit that reduces an undershoot.

FIGS. 6 and 7 are circuit diagrams showing the configuration of a class-D amplifier 100A having ringing reduction circuits 40NA and 40PA according to an embodiment 2 of the invention. FIG. 6 shows the circuit configuration of the ringing reduction circuit 40NA and FIG. 7 shows the circuit configuration of the ringing reduction circuit 40PA.

The class-D amplifier 100A is a semiconductor integrated circuit in which the individual circuits shown in FIGS. 6 and 7 are formed on a semiconductor substrate and sealed in a package. A high-potential power line 111 which is connected to the high-potential power terminal 101 and a low-potential power line 112 which is connected to the low-potential power terminal 102 are formed on the semiconductor substrate. A power supply current is supplied from the power source VDD to the individual circuits constituting the class-D amplifier 100A via the high-potential power line 131, the high-potential power terminal 101, a parasitic inductance 141 of a lead, a bonding wire etc., and the high-potential power line 111. A power supply current that has passed through the individual circuits goes to the negative pole of the power source VDD via the low-potential power line 112, a parasitic inductance 142 of a lead, a bonding wire, etc., the low-potential power terminal 102, and the low-potential power line 132.

The class-D amplifier 100A is a semiconductor integrated circuit in which the individual circuits shown in FIGS. 6 and 7 are formed on a semiconductor substrate and sealed in a package. A high-potential power line 111 which is connected to the high-potential power terminal 101 and a low-potential power line 112 which is connected to the low-potential power terminal 102 are formed on the semiconductor substrate. A power supply current is supplied from the power source VDD to the individual circuits constituting the class-D amplifier 100A via the high-potential power line 131, the high-potential power terminal 101, a parasitic inductance 141 of a lead, a bonding wire etc., and the high-potential power line 111. A power supply current that has passed through the individual circuits go to the negative pole of the power source VDD via the low-potential power line 112, a parasitic inductance 142 of a lead, a bonding wire, etc., the low-potential power terminal 102, and the low-potential power line 132.

In the class-D amplifier 100A, a PWM modulator 10 is a circuit for outputting pulse-width-modulated pulses in accordance with the level of an input signal that is supplied via the input terminal 103. A predriver 20 is a circuit for driving an output buffer circuit 30 according to those pulses. In the illustrated example, the output buffer circuit 30 is a circuit having what is called an inverter structure and is composed of a p-channel field-effect transistor (hereinafter referred to simply as "p-channel transistor") 30P and an n-channel field-effect transistor (hereinafter referred to simply as "n-channel transistor") 30N which are inserted between the high-potential power line 111 and the low-potential power line 112. The drains of the p-channel transistor 30P and the n-channel transistor 30N are connected to each other and their connecting point is connected to the output terminal 104 via an output signal line 120. The predriver 20 supplies pulses GP and GN to the gates of the respective transistors 30P and 30N so that the load 200 is energized in periods corresponding to the pulse widths of the pulses supplied from the PWM modulator 10. To prevent what is called a flow-through current, the predriver 20 includes a circuit for performing timing adjustment to the pulses to be supplied to the gates of the respective transistors 30P and 30N so that the transistors 30P and 30N are not turned on simultaneously.

The ringing reduction circuits 40NA and 40PA are circuits that are unique to the embodiment 2. As shown in FIG. 6, the ringing reduction circuit 40NA is composed of an n-channel transistor 401 as a switching element and a comparator 410 as a ringing detector. The drain of the transistor 401 is connected to the output signal line 120 which transmits an output signal OUT of the output buffer circuit 30 to the external load 200, and the source of the transistor 401 is connected to the low-potential power line 112 of the high-potential power line 111 and the low-potential power line 112 which supply a power supply voltage to the output buffer circuit 30. The comparator 410 has p-channel transistors 411 and 412 and constant current sources 413 and 414. The source of the transistor 411 serves as a non-inverting input terminal (plus terminal) of the comparator 410 and is connected to the output signal line 120. The source of the transistor 412 serves as an inverting input terminal (minus terminal) of the comparator 410 and is connected to the high-potential power line 111. The gates of the transistors 411 and 412 are connected to the drain of the transistor 412, and the drain of the transistor 412 is connected to the low-potential power line 112 via the constant current source 414. The drain of the transistor 411 is connected to the low-potential power line 112 via the constant current source 413. The connecting point of the drain of the transistor 411 and the constant current source 413 serves as an output terminal of the comparator 410 and is connected to the gate of the transistor 401. Having the above configuration, the comparator 410 compares the output signal OUT to be supplied to the load 200 via the output signal line 120 with the level PVDDI (reference level) of the high-potential power l7ine 111. If the output signal OUT exceeds the reference level in the positive direction (occurrence of an overshoot), the comparator 410 supplies an H-level gate voltage to the transistor 401 and thereby turns on the transistor 401 which is the switching element.

As shown in FIG. 7, the ringing reduction circuit 40PA is composed of an n-channel transistor 402 as a switching element, a comparator 420 as a ringing detector, and an inverter 429. The source of the transistor 402 is connected to the output signal line 120 and the drain of the transistor 402 is connected to the high-potential power line 111. The comparator 420 has n-channel transistors 421 and 422 and constant current sources 423 and 424. The source of the transistor 421 serves as a non-inverting input terminal (plus terminal) of the comparator 420 and is connected to the output signal line 120. The source of the transistor 422 serves as an inverting input terminal (minus terminal) of the comparator 420 and is connected to the low-potential power line 112. The gates of the transistors 421 and 422 are connected to the drain of the transistor 422, and the drain of the transistor 422 is connected to the high-potential power line 111 via the constant current source 424. The drain of the transistor 421 is connected to the high-potential power line 111 via the constant current source 423. The connecting point of the drain of the transistor 421 and the constant current source 423 serves as an output terminal of the comparator 420 and is connected to the gate of the transistor 402 via the inverter 429. Having the above configuration, the comparator 420 compares the output signal OUT to be supplied to the load 200 via the output signal line 120 and the level PVSSI (reference level) of the low-potential power line 112. If the output signal OUT exceeds the reference level in the negative direction (occurrence of an undershoot), the comparator 420 outputs an L-level signal. The inverter 429 inverts the output signal of the comparator 420 to an H-level, and supplies it to the gate of the transistor 402 to turn on the transistor 402.

In the embodiment 2, when an overshoot or undershoot occurs in an output signal OUT on the output signal line 120, the transistor 401 or 402 which is the switching element plays a role of reducing the overshoot or undershoot by releasing excess energy by causing a discharge from the output signal line 120 to the low-potential power line 112 or the high-potential power line 111. Therefore, to reduce an overshoot or undershoot by a proper degree, it is desired that the channel widths of the transistors 401 and 402 be set at proper values. In a preferred form, the channel widths of the transistors 401 and 402 are set at about 1/100 of the channel width of the transistor 30N.

The ringing reduction circuit 40PA may be modified in such a manner that the n-channel transistor 402 is replaced by a p-channel transistor and an output signal of the comparator 420 is supplied to the gate of the p-channel transistor directly, that is, without passing through the inverter 429. The reason why the n-channel transistor 402, rather than a p-channel transistor, is employed in the embodiment 2 is that the on-resistance of an n-channel transistor can be made smaller than that of a p-channel transistor having the same channel width.

Figure 8:
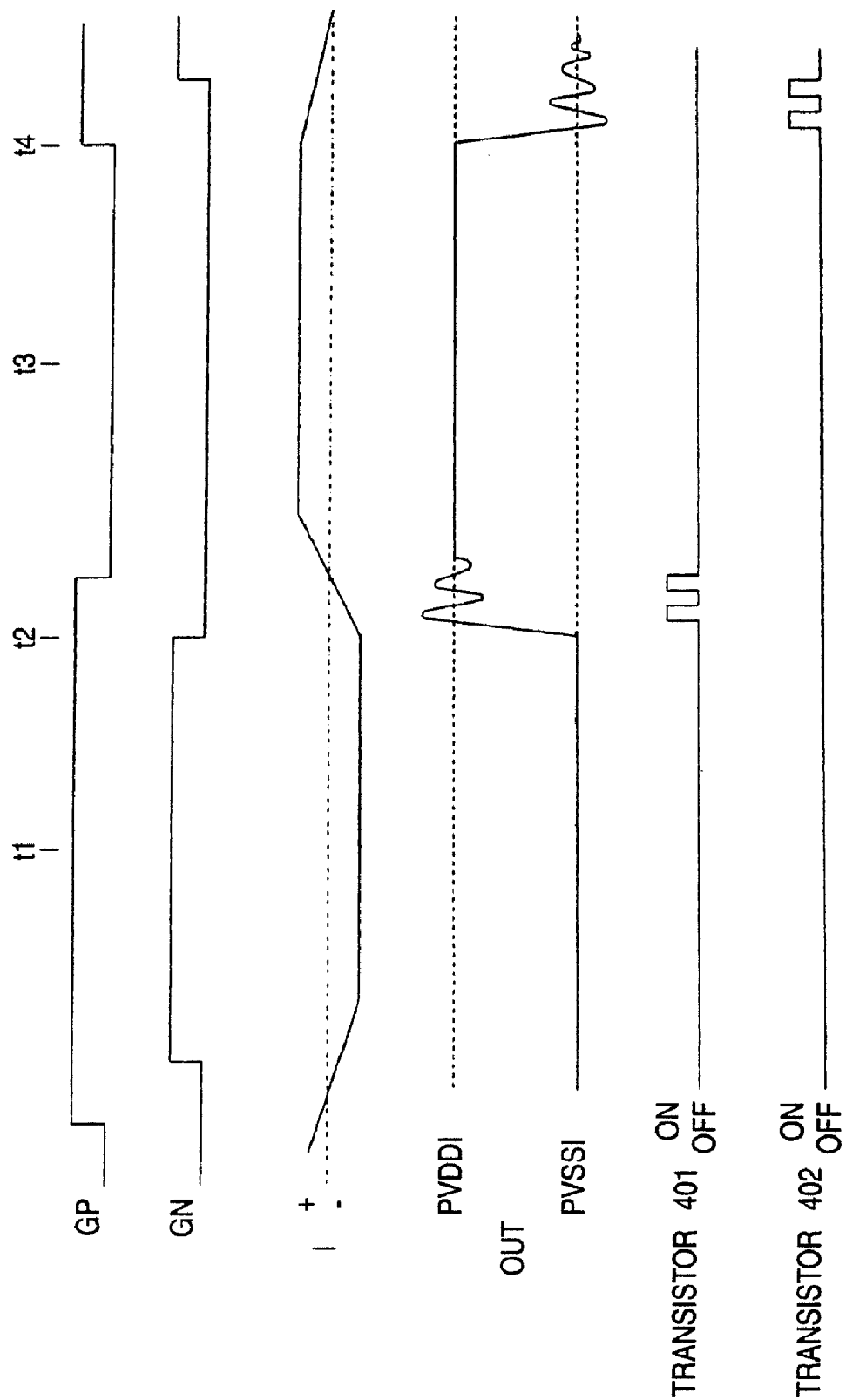
FIG. 8 is a waveform diagram showing waveforms at individual components etc. of the embodiment 2.

FIG. 8 is a waveform diagram showing waveforms at individual components etc. of the embodiment 2. As shown in FIG. 8, in the class-D amplifier 100A, pulses GP and GN to be supplied to the gates of the respective transistors 30P and 30N are generated so that the transistors 30P and 30N are turned on alternately. To prevent occurrence of a flow-through current at the time of on/off switching of each transistor, the predriver 20 outputs the pulses GP and GN that are timing-adjusted as shown in FIG. 8 so that the transistor 30N is switched from an off state to an on state after the transistor 30P is switched from an on state to an off state and that the transistor 30P is switched from an off state to an on state after the transistor 30N is switched from an on state to an off state.

At time t1 shown in FIG. 8, the transistor 30P is in an off state and the transistor 30N is in an on state. Therefore, a negative current I flows from the load 200 to the transistor 30N. At time t2, the transistor 30N is turned off. At this time, the path of the current I that has flown through the load 200 which is an inductive load is interrupted. And the current that has flown through the load 200 comes to flow to the power source VDD via, for example, a parasitic diode formed between the drain of the transistor 30P and its backside n-type substrate and a parasitic inductance of a bonding wire etc., whereby an oscillatory high voltage is induced across the load 200. As a result, ringing tends to occur in the signal OUT. In contrast, in the embodiment 2, in the period when an overshoot is occurring in which the value of the signal OUT exceeds the level PVDDI of the high-potential power line 111 in the positive direction, a high-level gate voltage is supplied from the comparator 410 of the ringing reduction circuit 40NA to the n-channel transistor 401, whereby the n-channel transistor 401 is kept on. As a result, the n-channel transistor 401 allows a current to flow (i.e., a discharge to occur) from the output signal line 120 to the low-potential-power line 112. The overshoot in the signal OUT is thus reduced as shown in FIG. 8.

At time t3, the transistor 30P is in an on state and the transistor 30N is in an off state. Therefore, a positive current I flows from the transistor 30P to the load 200. At time t4, the transistor 30P is turned off. At this time, the path of the current I that has flown through the load 200 which is an inductive load is interrupted. And the current that has flown through the load 200 comes to flow via, for example, a parasitic diode formed between the drain of the transistor 30N and its backside p-type substrate and a parasitic inductance of a bonding wire etc., whereby an oscillatory high voltage is induced across the load 200. As a result, ringing tends to occur in the signal OUT. In contrast, in the embodiment 2, in the period when an undershoot is occurring in which the value of the signal OUT exceeds the level PVSSDI of the low-potential power line 112 in the negative direction, the transistor 402 of the ringing reduction circuit 40PA is kept on. As a result, the transistor 402 allows a discharge to occur from the output signal line 120 to the high-potential-power line 111. The undershoot in the signal OUT is thus reduced as shown in FIG. 8.

As described above, the embodiment 2 can reduce ringing without sacrificing the operation speed of the class-D amplifier 100A.

Embodiment 3

Figure 9:
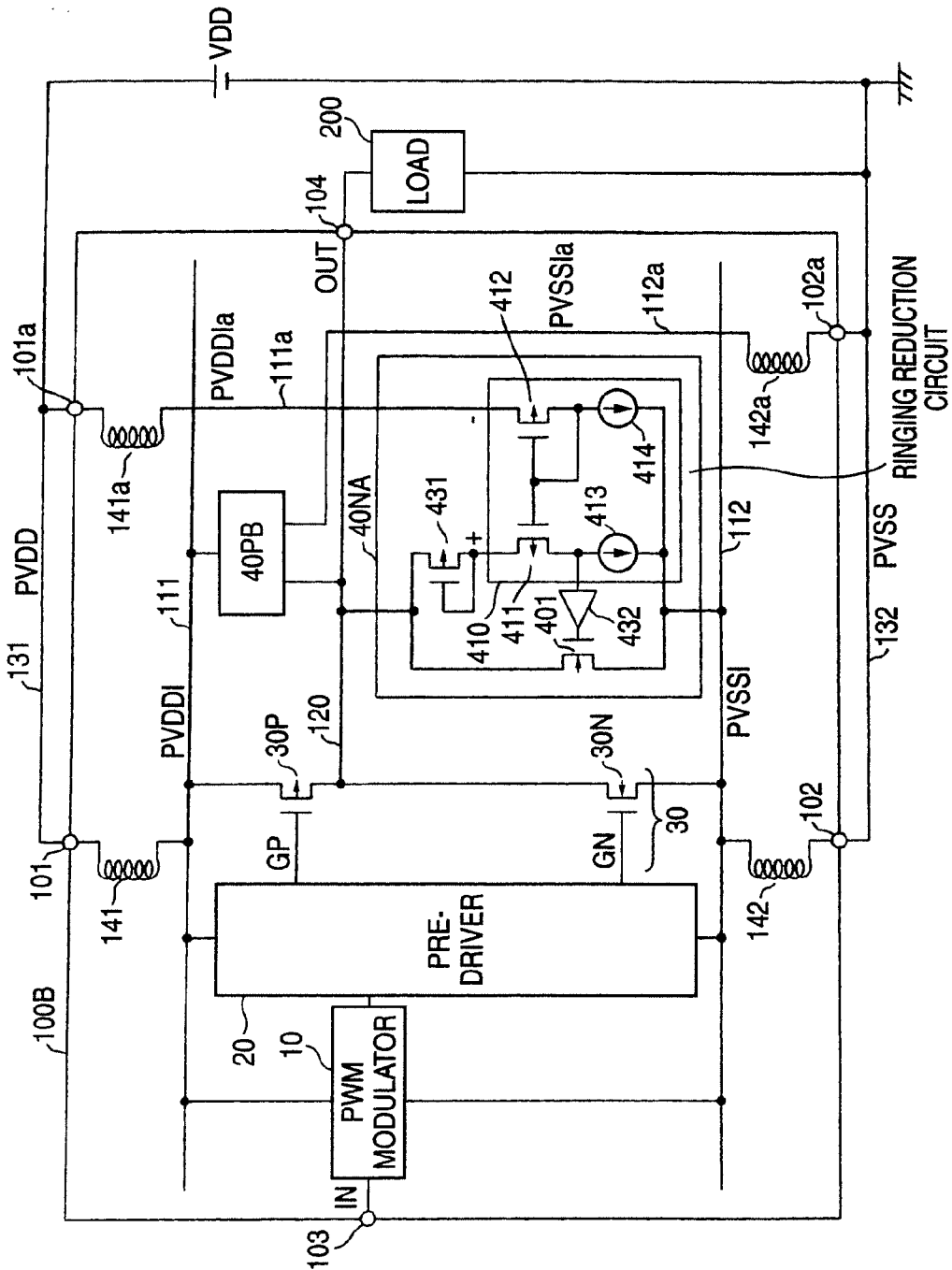
FIG. 9 is a circuit diagram showing the configuration of a class-D amplifier having ringing reduction circuits according to an embodiment 3 of the invention and, in particular, showing the configuration of a ringing reduction circuit that reduces an overshoot.
Figure 10:
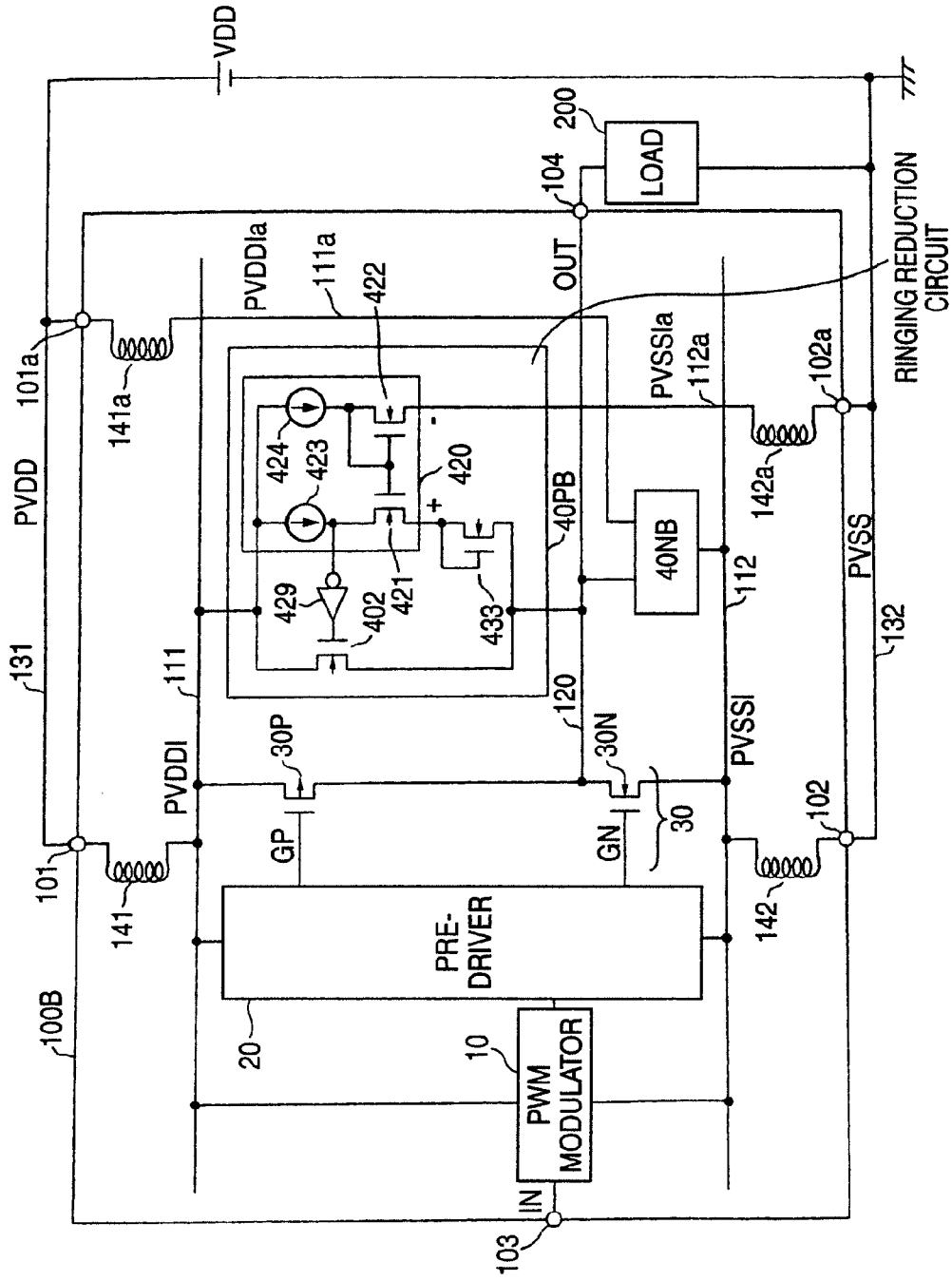
FIG. 10 is a circuit diagram showing the configuration of the same class-D amplifier of FIG. 9 and, in particular, showing the configuration of a ringing reduction circuit that reduces an undershoot.

FIGS. 9 and 10 are circuit diagrams showing the configuration of a class-D amplifier 100B having ring reduction circuits 40PB and 40NB according to an embodiment 3 of the invention. FIG. 9 shows the circuit configuration of the ringing reduction circuit 40NB and FIG. 10 shows the circuit configuration of the ringing reduction circuit 40PB. In FIGS. 9 and 10, components having corresponding components in FIGS. 6 and 7 referred to above are given the same reference symbols as the latter and will not be described.

In the embodiment 2, the comparators 410 and 420 which are the ringing detector detect occurrence of ringing in the output signal OUT by comparing the level of the output signal line 120 with the level PVDDI of the high-potential power line 111 or the level PVSSI of the low-potential power line 112.

However, when a switching current of the output buffer circuit 30 flows through the parasitic inductance 141 or 142, a large counterelectromotive force is induced in the parasitic inductance 141 or 142, whereby oscillatory noise is generated in the level PVDDI of the high-potential power line 111 or the level PVSSI of the low-potential power line 112. If the oscillatory noise has a large amplitude, the comparator 410 or 420 may erroneously turn on the comparator 410 or 420 to distort the output signal OUT of the output buffer circuit 30 even if no overshoot or undershoot is occurring in the output signal OUT.

In view of the above, in the embodiment 3, as shown in FIGS. 9 and 10, the class-D amplifier 100B is provided with a high-potential power terminal 101a and a low-potential power terminal 102a separately from the high-potential power terminal 101 and the low-potential power terminal 102 for supplying the power supply voltage to the individual circuits including the output buffer circuit 30. The high-potential power terminal 101a and the low-potential power terminal 102a are connected to the positive pole and the negative pole of the power source VDD, respectively. The comparator 410 of the ringing reduction circuit 40NB detects an overshoot in the output signal OUT by comparing the output signal OUT with the level PVDDIa of a high-potential power line 111a which is connected to the high-potential power terminal 101a. The comparator 420 of the ringing reduction circuit 40PB detects an undershoot in the output signal OUT by comparing the output signal OUT with the level PVSSIa of a low-potential power line 112a which is connected to the low-potential power terminal 102a.

The ringing reduction circuit 40NB is configured in such a manner that a p-channel transistor 431 and a non-inverting buffer 432 are added to the ringing reduction circuit 40NA of the above-described embodiment 2. The source of the transistor 431 is connected to the output signal line 120 and its gate and the drain are connected to the source of the transistor 411. The transistor 431 serves to lower the sensitivity of the comparator 410 so that the comparator 410 does not react too sensitively to a subtle oscillation that is too small to be called an overshoot when it occurs in the output signal OUT. Likewise, an n-channel transistor 433 for lowering the sensitivity of the comparator 420 is added to the ringing reduction circuit 40PB. The non-inverting buffer 432 serves to generate a gate voltage being of such a level as to allow the transistor 401 to be switched on/off reliably.

In the embodiment 3, a parasitic inductance 141a of a lead, a bonding wire, etc. exists between the high-potential power line 111a and the high-potential power terminal 101a and a parasitic inductance 142a of a lead, a bonding wire, etc. exists between the low-potential power line 112a and the low-potential power terminal 102a. However, since the output buffer circuit 30 is not inserted between the high-potential power terminal 101a and the low-potential power terminal 102a, no switching current of the output buffer circuit 30 flows through the parasitic inductance 141a or 142a. Therefore, the level PVDDIa of the high-potential power line 111a and the level PVSSIa of the low-potential power line 112a are lower in noise and hence are more stable than the level PVDDI of the high-potential power line 111 and the level PVSSI of the low-potential power line 112, respectively. As such, the embodiment 3 can prevent erroneous detection of an overshoot or an undershoot in the output signal OUT even in the case where large noise occurs in the level PVDDIa of the high-potential power line 111a or the level PVSSIa of the low-potential power line 112a due to switching of the output buffer circuit 30.

Embodiment 4

Figure 11:
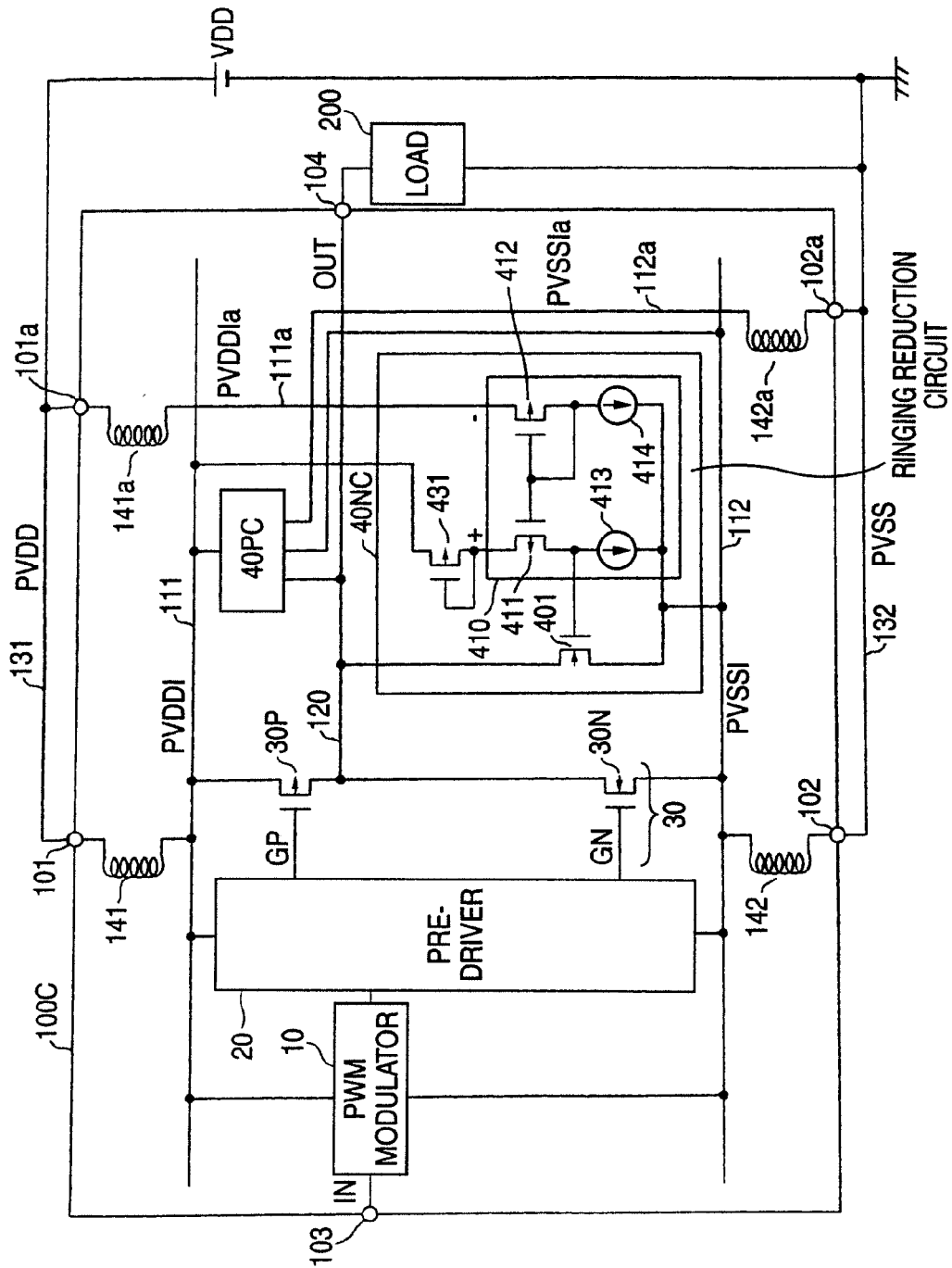
FIG. 11 is a circuit diagram showing the configuration of a class-D amplifier having ringing reduction circuits according to an embodiment 4 of the invention and, in particular, showing the configuration of a ringing reduction circuit that reduces an overshoot.
Figure 12:
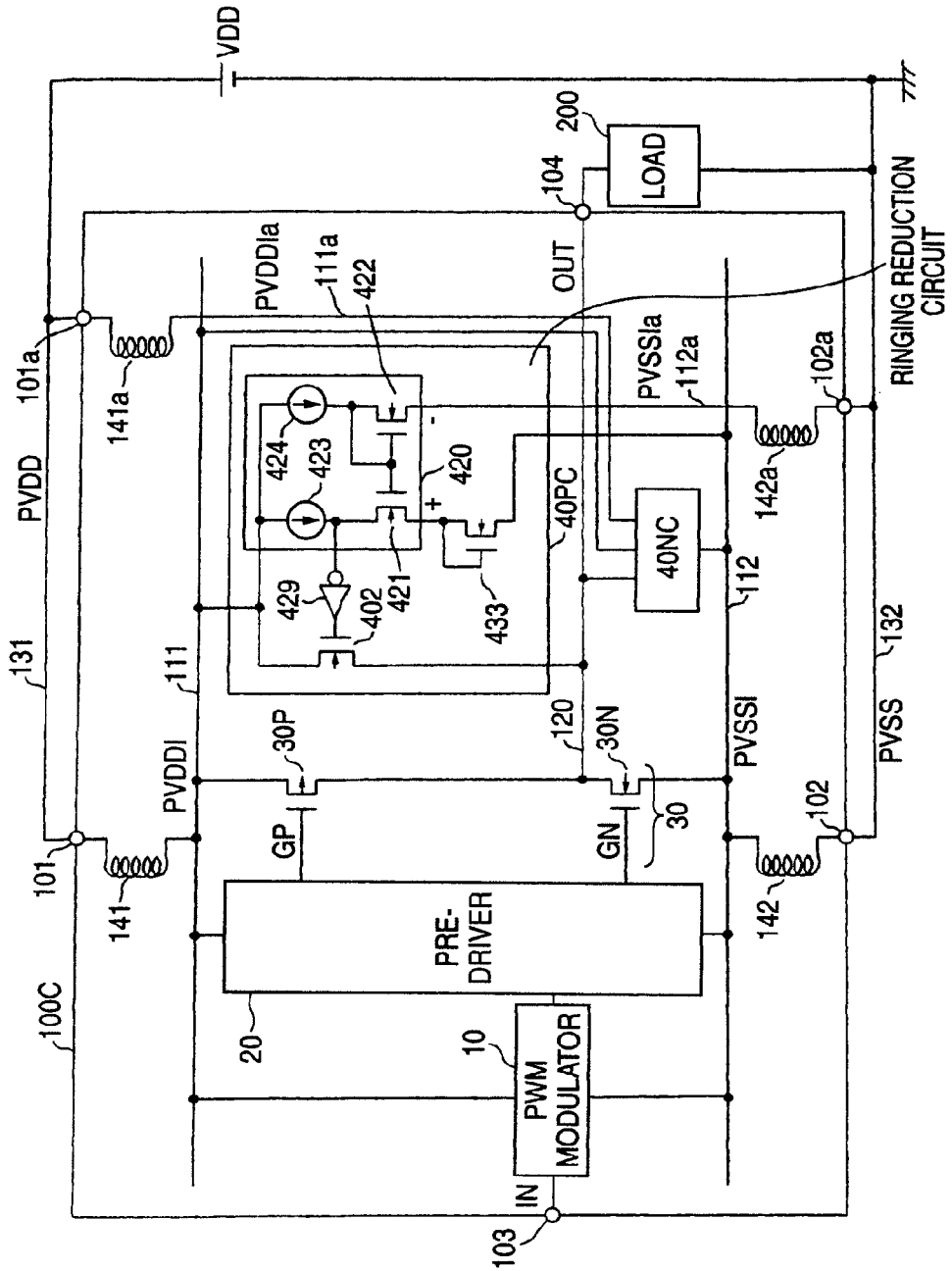
FIG. 12 is a circuit diagram showing the configuration of the same class-D amplifier of FIG. 11 and, in particular, showing the configuration of a ringing reduction circuit that reduces an undershoot.

FIGS. 11 and 12 are circuit diagrams showing the configuration of a class-D amplifier 100C having ring reduction circuits 40PC and 4ONC according to an embodiment 4 of the invention. FIG. 11 shows the circuit configuration of the ringing reduction circuit 4ONC and FIG. 12 shows the circuit configuration of the ringing reduction circuit 40PC. In FIGS. 11 and 12, components having corresponding components in FIGS. 6, 7, 9 and 10 referred to above are given the same reference symbols as the latter and will not be described.

Also in the embodiment 4, as in the case of the embodiment 3, the class-D amplifier 100C is provided with a high-potential power terminal 101a and a low-potential power terminal 102a separately from the high-potential power terminal 101 and the low-potential power terminal 102 for supplying the power supply voltage to the individual circuits including the output buffer circuit 30. The high-potential power terminal 101a and the low-potential power terminal 102a are connected to the positive pole and the negative pole of the power source VDD, respectively. To detect an overshoot or an undershoot, the level PVDDIa of a high-potential power line 111a connected to the high-potential power terminal 101a and the level PVSSIa of a low-potential power line 112a connected to the low-potential power terminal 102a are used as reference levels.

In the embodiment 4, a parasitic diode formed between the drain of the p-channel transistor 30P and its backside n-type substrate is inserted between the output signal line 120 and the high-potential power line 111. Therefore, when an overshoot occurs in the output signal OUT, an overshoot that is lower in potential than the output signal OUT by approximately a forward voltage VB of the parasitic diode occurs in the level PVDDI of the high-potential power line 111. Furthermore, a parasitic diode formed between the drain of the n-channel transistor 30N and its backside p-type substrate is inserted between the output signal line 120 and the low-potential power line 112. Therefore, when an undershoot occurs in the output signal OUT, an undershoot that is higher in potential than the output signal OUT by approximately a forward voltage VB of the parasitic diode occurs in the level PVSSI of the low-potential power line 112.

In view of the above, the comparator 410 of the ringing reduction circuit 40NC of the embodiment 4 compares the level PVDDI of the high-potential power line 111 with the level PVDDIa of the high-potential power line 111a which is lower in noise and hence is more stable than the former. If the former level PVDDI is higher than the latter level PVDDIa, the comparator 410 outputs a signal for turning on the transistor 401. The comparator 420 of the ringing reduction circuit 40PC of the embodiment 4 compares the level PVSSI of the low-potential power line 112 with the level PVSSIa of the low-potential power line 112a which is lower in noise and hence is more stable than the former. If the former level PVSSI is lower than the latter level PVSSIa, the comparator 420 outputs a signal for turning on the transistor 402.

The embodiment 4 provides the same advantage as the embodiment 3.

Although the embodiments 2-4 of the invention have been described above, other various embodiments are possible in the invention, examples of which are as follows:

(1) Although in the above embodiments the invention is applied to the class-D amplifier having the output buffer circuit 30 of the inverter structure, the invention can also be applied to a class-D amplifier having an output buffer circuit of a bridge structure which uses two transistor pairs of a p-channel transistor and an n-channel transistor. Furthermore, the application range of the invention is not limited to class-D amplifiers and the invention can also be applied to various kinds of semiconductor integrated circuits in which reduction of ringing is desired.

(2) Although in the above embodiments both of the ringing reduction circuit for reducing an overshoot and the ringing reduction circuit for reducing an undershoot are provided in the semiconductor integrated circuit, only one of them may be provided.

(3) Although in the above embodiments the ringing reduction circuits are provided inside the semiconductor integrated circuit, they may be provided outside the semiconductor integrated circuit and connected to it.

(4) The high-potential power line 111a and the low-potential power line 112a maybe connected to locations in the semiconductor integrated circuit where the power supply voltage is stable.

What is claimed is:

1. A ringing reduction circuit provided inside a semiconductor integrated circuit that includes an output buffer circuit and an output signal line for transmitting an output signal of the output buffer to a load outside the semiconductor integrated circuit, the ringing reduction circuit comprising:
a switching element inserted between the output signal line and a high-potential power line or a low-potential power line for supplying a power supply voltage to the output buffer circuit; and
a ringing detector that outputs a signal for turning on the switching element when ringing occurs in the output signal and the output signal exceeds a reference level in a positive or negative direction, wherein the ringing detector comprises a comparator for detecting that the output signal exceeds the reference level in the positive or negative direction by comparing a level of the high-potential power line or the low-potential power line with a level of a power line that is different from the high-potential power line and the low-potential power line and is not part of a path of a switching current flowing through the output buffer circuit.

2. The ringing reduction circuit according to claim 1, wherein
the switching element is inserted between the output signal line and the low-potential power line, and
the ringing detector outputs a signal for turning on the switching element when detecting that the output signal exceeds, in the positive direction, the reference level that is a level of the high-potential power line or a level that is more stable than the level of the high-potential power line.

3. The ringing reduction circuit according to claim 1, wherein
the switching element is inserted between the output signal line and the high-potential power line, and
the ringing detector outputs a signal for turning on the switching element when detecting that the output signal exceeds, in the negative direction, the reference level that is a level of the low-potential power line or a level that is more stable than the level of the low-potential power line.

4. The ringing reduction circuit according to claim 1, wherein
the switching element comprises a first switching element inserted between the output signal line and the low-potential power line and a second switching element inserted between the output signal line and the high-potential power line; and
the ringing detector comprises a first comparator for outputting a signal for turning on the first switching element when detecting that the output signal exceeds, in the positive direction, a first reference level that is a level of the high-potential power line or a level that is more stable than the level of the high-potential power line and a second comparator for outputting a signal for turning on the second switching element when detecting that the output signal exceeds, in the negative direction, a second reference level that is a level of the low-potential power line or a level that is more stable than the level of the low-potential power line.

5. A semiconductor integrated circuit comprising:
circuitry for outputting a pulse subjected to pulse width modulation in accordance with a level of an input signal;
an output buffer circuit, responsive to the pulse width modulated pulse, for providing an output signal on an output signal line which is coupled to a load external to the semiconductor integrated circuit; and
a ringing reduction circuit, the ringing reduction circuit including:
a switching element inserted between the output signal line and a high-potential power line or a low-potential power line for supplying a power supply voltage to the output buffer circuit; and
a ringing detector that outputs a signal for turning on the switching element when ringing occurs in the output signal and the output signals exceeds a reference level in a positive or negative direction, wherein the ringing detector includes a comparator for detecting that the output signal exceeds the reference level in the positive or negative direction by comparing a level of the high-potential power line or the low-potential power line with a level of a power line than is different from the high-potential power line and the low-potential power line and is not part of a path of a switching current flowing through the output buffer circuit.

* * * * *